United States Patent [19]

Hulsing, II et al.

[11] Patent Number: 5,097,490

[45] Date of Patent: Mar. 17, 1992

[54] APPARATUS AND METHOD FOR IMPROVING THE RESOLUTION WITH WHICH A TEST SIGNAL IS COUNTED

[75] Inventors: Rand H. Hulsing, II, Redmond; Charles K. Lee, Seattle, both of Wash.

[73] Assignee: Sundstrand Data Control, Inc., Redmond, Wash.

[21] Appl. No.: 640,985

[22] Filed: Jan. 14, 1991

[51] Int. Cl.⁵ .......................................... G06M 3/12
[52] U.S. Cl. .................................. 377/28; 324/78 D; 324/79 D
[58] Field of Search ................ 377/20, 28; 324/78 D, 324/79 D, 83 D; 368/118

[56] References Cited

U.S. PATENT DOCUMENTS

| | | | |
|---|---|---|---|
| 4,162,443 | 7/1979 | Brearley | 324/78 D |
| 4,224,568 | 9/1980 | Griner | 324/78 D |
| 4,395,762 | 7/1983 | Wondergem | |
| 4,454,470 | 6/1984 | Boettner | |
| 4,541,105 | 9/1985 | Lee | |
| 4,544,884 | 10/1985 | Hayashi | |
| 4,584,528 | 4/1986 | Ohmae | 377/20 |
| 4,607,217 | 8/1986 | Bhargava | |
| 4,609,990 | 9/1986 | Sember | |
| 4,669,098 | 5/1987 | Boatwright | 377/28 |
| 4,670,712 | 6/1987 | Lavergnat | |
| 4,786,861 | 11/1988 | Hulsing | |

FOREIGN PATENT DOCUMENTS

0276925 12/1987 Japan ..................... 377/28

*Primary Examiner*—Kenneth A. Wieder
*Assistant Examiner*—Jose M. Solis
*Attorney, Agent, or Firm*—Christensen, O'Connor, Johnson & Kindness

[57] ABSTRACT

Apparatus and method for counting frequency of a signal with improved resolution. Frequency counters (10, 60, and 100) accumulate clock cycles from a reference oscillator (20) during a sample interval. In the simplest form of the frequency counter, the reference clock signal is inverted and both the noninverted and inverted clock cycles are accumulated in separate counters (40 and 44). The accumulated counts are totaled in a summing circuit (48) and divided by two to determine their average, thereby doubling the resolution of the frequency counter. A more complex embodiment of the invention corrects a raw count of cycles of an input signal (12) that are accumulated during an extended sample interval defined by successive rising edges of a sample signal (114). The fractional portion of a cycle of the input waveform that occurred prior to the beginning of the extended sample interval is added to the raw count and the fractional portion of the input waveform that occurred after the end of the extended sample interval is subtracted. These fractional portions are defined as ratios of a partial count of clock cycles to a full count of clock cycled. The partial count is the number of clock cycles occurring between a rising edge of the sample signal and the next rising edge of the input signal, while the full count is the number of clock cycles occurring between successive rising edges of the input signal. One-half clock logic circuits (126 and 136) double the resolution of the counts accumulated by a partial counter (122) and a full counter (142), thereby doubling the resolution with which the ratios of the two counts are determined.

14 Claims, 8 Drawing Sheets

APPARATUS AND METHOD FOR IMPROVING THE RESOLUTION WITH WHICH A TEST SIGNAL IS COUNTED

TECHNICAL FIELD

This invention generally pertains to an apparatus and method for determining a frequency or period of a periodic signal, and more specifically, to an apparatus and method for improving the resolution with which the frequency of a signal is counted in respect to cycles of a reference clock.

BACKGROUND OF THE INVENTION

Accelerometers and other types of sensors often include one or more crystal oscillators that produce a signal having a frequency that varies as a function of a measured parameter, such as acceleration. The frequency of this signal can be determined simply by counting the number of cycles of the signal occurring during a sample time of known duration. However, instrumentation used to monitor the frequency of a crystal oscillator in applications requiring high resolution typically "counts the frequency" in terms of cycles of a reference clock operating at a much higher frequency than the sensor crystal and thus avoids having to measure frequency over unacceptably long sample periods. The frequency-counting instrumentation typically includes a counter that accumulates reference clock cycles during one or more periods of a square wave signal that is input to the counter, where each period extends from a rising edge to a successive rising edge, or from a falling edge to a successive falling edge of the square wave. Even better resolution of the signal frequency is achieved in real time, during continuous frequency monitoring, by using a combination of the two techniques, i.e., by counting an integer number of cycles of the sensor signal that start during a sample time and correcting the integer number for any fractional portions of the sensor period that occur at the beginning and at the end of the sample time. The fractional portions of the sensor period are determined by counting cycles of the reference clock on additional counters.

Commonly assigned U.S. Pat. No. 4,786,861 discloses a frequency-counting apparatus and method that uses an integer cycle counter in combination with counters that determine fractional portions of a sensor signal to achieve high resolution. The integer counter accumulates the total number of sensor periods or cycles that begin during a sample time. A partial period counter accumulates reference clock cycles during the portion of a sensor signal period or cycle that immediately follows the end of a sample time, and a full period counter determines the number of reference clock cycles that occurred during that entire sensor signal period or cycle, starting from just prior to the end of the sample time. The ratio of these two counts, i.e., the partial count divided by the full count, defines a fractional portion of the sensor signal period or cycle that must be subtracted from the integer cycle count. In addition, a fractional portion of the sensor signal period, which was determined at the end of the last sample time and stored, is added to the result, yielding a corrected total count for the sample time. The frequency of the sensor signal is then determined simply by dividing the corrected total count by the known sample time.

Prior art techniques for counting the frequency of a signal cannot resolve more than ± one clock cycle. The process technology (e.g., CMOS, ECL) used for the circuitry employed in a frequency counter may limit the reliable maximum speed of the reference clock employed, particularly where the circuitry is exposed to wide temperature variations. Even the technique described in the above-referenced patent is thus limited in resolution. Furthermore, special circuitry for increasing the speed of the reference clock so that it operates reliably over extreme temperature ranges can be expensive to implement.

Accordingly, it is an object of the present invention to effectively double the resolution with which a frequency is counted without increasing the speed of the reference clock employed. It is a further object to accomplish the increased resolution without doubling the circuitry required. A still further object is to substantially improve the resolution with which real-time counting of the signal is achieved, without significant post processing of the results to determine a count. These and other objects and advantages of the present invention will be apparent from the attached drawings and the Description of the Preferred Embodiments that follow.

SUMMARY OF THE INVENTION

In accordance with this invention, a circuit is provided that has improved resolution for counting a test signal in respect to cycles of a clock signal produced by a reference oscillator. The circuit includes counter means that are operative to accumulate an integer count of cycles of the clock signal during a sample interval. Gating means, connected to receive the clock signal and the test signal, provide a gated clock signal that is applied to the counter means only during the sample interval. Connected to receive the clock signal and the gated clock signal are logic means. The logic means determine a correction that is added to the integer count. This correction is a function of whether the sample interval begins and ends during a first or a second half of the clock cycle then occurring. The correction is equal to: (a) $-\frac{1}{2}$, if the sample interval begins during the second half of a clock cycle and ends during the first half of a clock cycle; (b) 0, if the sample interval begins during the second half of a clock cycle and ends during the second half of a clock cycle; (c) 0, if the sample interval begins during the first half of a clock cycle and ends during the first half of a clock cycle; (d) or, $\frac{1}{2}$, if the sample interval begins during the first half of a clock cycle and ends during the second half of a clock cycle. This correction thus effectively doubles the count resolution.

In one form of the invention, the counter means accumulate a predefined quantity of clock signals less than the integer number of clock cycles that actually occur during the sample interval. The logic means are then further operative to correct for the omission of this predefined quantity from the integer count.

Preferably, the logic means comprise a plurality of logic gates.

In one aspect of the invention, the sample interval corresponds to one cycle of the test signal. In another aspect of the invention, the sample interval is less than one cycle of the test signal in duration and ends synchronously with a cycle of the test signal.

The counter means can comprise a partial counter that accumulates a partial count of clock cycles during a partial count sample interval that begins synchronously with a cycle of the sample signal, is less than one cycle of the test signal in duration, and ends synchronously with a cycle of the test signal. Further, the counter means include a full counter that accumulates a full count of clock cycles during a sample interval that begins synchronously with one cycle of the test signal and ends synchronously with a cycle of the test signal.

The logic means comprise a partial count logic circuit that determines a partial count correction. The partial count correction is added to the partial integer count to define a corrected partial count having a resolution to $\pm\frac{1}{4}$ cycle of the clock signal. In addition, the logic means include a full count logic circuit that determines a full count correction. A corrected full count with a resolution to $\pm\frac{1}{4}$ cycle of the clock signal results from adding the full count correction to the full integer count. The partial count correction and the full count correction are determined consistent with the relative times at which their respective sample intervals begin and end, as explained above.

The circuit also includes means for counting an integer number of cycles of the test signal occurring during an extended sample interval, producing a raw integer count. Processor means are operative to determine a fractional portion of a cycle of the test signal that occurs after the end of the extended sample interval, the fractional portion being equal to a ratio of the corrected partial count and the corrected full count. In addition, means are included for storing the fractional portion from a preceding extended sample interval. The processor means correct the raw integer count by adding to it the fractional portion for the preceding extended sample interval and subtracting from it the fractional portion for the current extended sample interval.

A method for counting a test signal in respect to cycles of a clock signal with improved resolution is another aspect of this invention. The method includes steps generally corresponding to the functions performed by the elements of the circuit described above.

Description of the Preferred Embodiments

Figure 1:
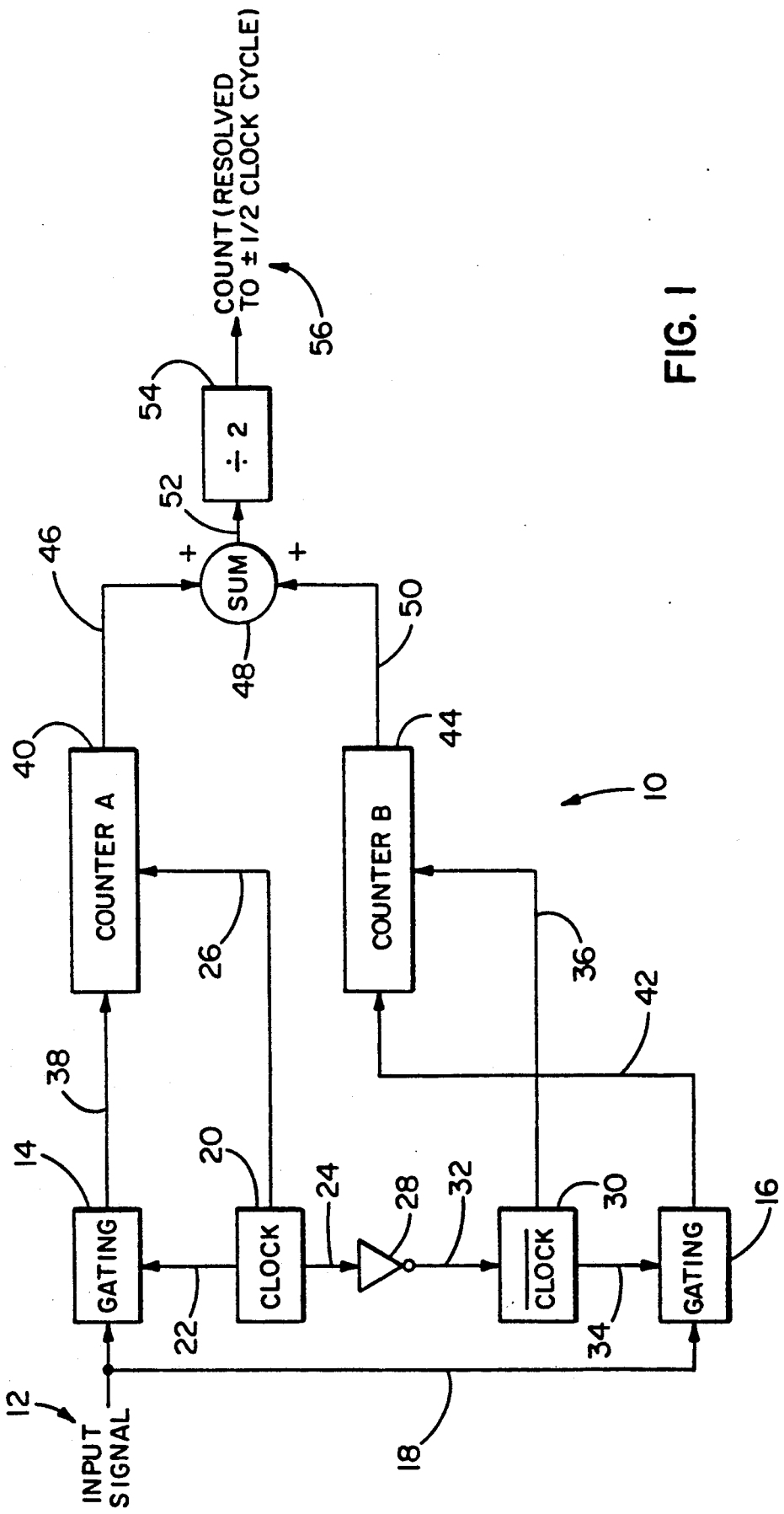
FIG. 1 is a schematic block diagram of a first embodiment of the present invention, which uses separate counters to count noninverted and inverted clock pulses.

FIG. 1 illustrates a first embodiment of a frequency counter employing the apparatus and method of the present invention to double the resolution with which the frequency of an input signal 12 is counted in terms of clock cycles from a reference oscillator 20. The first embodiment of the frequency counter is shown generally at a reference numeral 10. In frequency counter 10, input signal 12 is applied to both a gating logic circuit 14 and a gating logic circuit 16. In this and the following embodiments, input signal 12 comprises a periodic signal having defined rising and falling edges that determine an interval of time or sample interval during which the frequency of the input signal is counted. The frequency is counted in respect to the number of clock pulses that occur between either successive rising or falling edges of the input signal. It will be understood that frequency counter 10 can count the frequency of input signal 12 in respect to a single period of the input signal or in respect to a predefined integer number of periods of the input signal.

For purposes of thus determining the frequency of input signal 12, reference oscillator 20 supplies these clock cycles as a signal through a lead 22 to gating logic circuit 14 and through a lead 26 to a counter 40. In addition, counter 40 receives a signal that controls the period of time or sample interval during which it counts clock pulses from gating logic circuit 14 over a lead 38. Input signal 12 is conveyed to gating logic circuit 16 over a lead 18, but this gating logic circuit does not control the counting of clock cycles supplied directly from reference oscillator 20. Instead, the clock signal from reference oscillator 20 is applied through a lead 24 to an inverter 28, which provides an inverted clock signal 30 at its output. Inverted clock signal 30 is supplied through a lead 34 to gating logic circuit 16 and through a lead 36 to a counter 44. Thus, gating logic circuit 14 controls the accumulation of noninverted clock cycles by counter 40, and gating logic circuit 16 controls the accumulation of inverted clock cycles by counter 44.

The output of counter 40 is applied through a lead 46 to a summing circuit 48, where it is added to the output of counter 44, which is input to the summing circuit through a lead 50. The total count from counter 40 and from counter 44 is supplied through a lead 52 to a divide-by-two circuit 54. An output 56 from divide-by-two circuit 54 represents the frequency count for the input signal, resolved to $\pm\frac{1}{4}$ clock cycle.

The improved resolution of frequency counter 10 compared to the prior art frequency counters results from its ability to better resolve the beginning and end of the time interval over which clock pulses are accumulated by counter 40 and counter 44. For example, assume that the period of input signal 12 over which the frequency is counted extends from a rising edge of the input signal to the next successive rising edge. If the period of input signal 12 happens to begin during the first one-half of the clock signal period produced by reference oscillator 20, the first clock signal of the sample interval is not counted by counter 40 until more than one-half clock cycle later. However, counter 44 begins counting the inverted clock signal during the sample interval within less than one-half clock cycle after the first rising edge of input signal 12 occurs. Similarly, at the end of the sample interval during which clock cycles are accumulated, counter 40 stops accumulating clock cycles as soon as the next rising edge of the input signal occurs, and thus may include the one-half clock cycle preceding the second rising edge of input signal 12. However, counter 44 excludes that last one-half clock cycle in its total accumulation of inverted clock cycles. Use of the count of inverted clock cycles provides resolution to the nearest one-half clock cycle and therefore enables frequency counter 10 to double the resolution of prior art frequency counters that count only noninverted clock pulses. Although not shown in FIG. 1, it will be apparent that an additional counter can be provided to count multiple cycles of the input signal so that the inverted and noninverted clock cycles are accumulated and averaged over multiple cycles of input signal 12.

Figure 2:
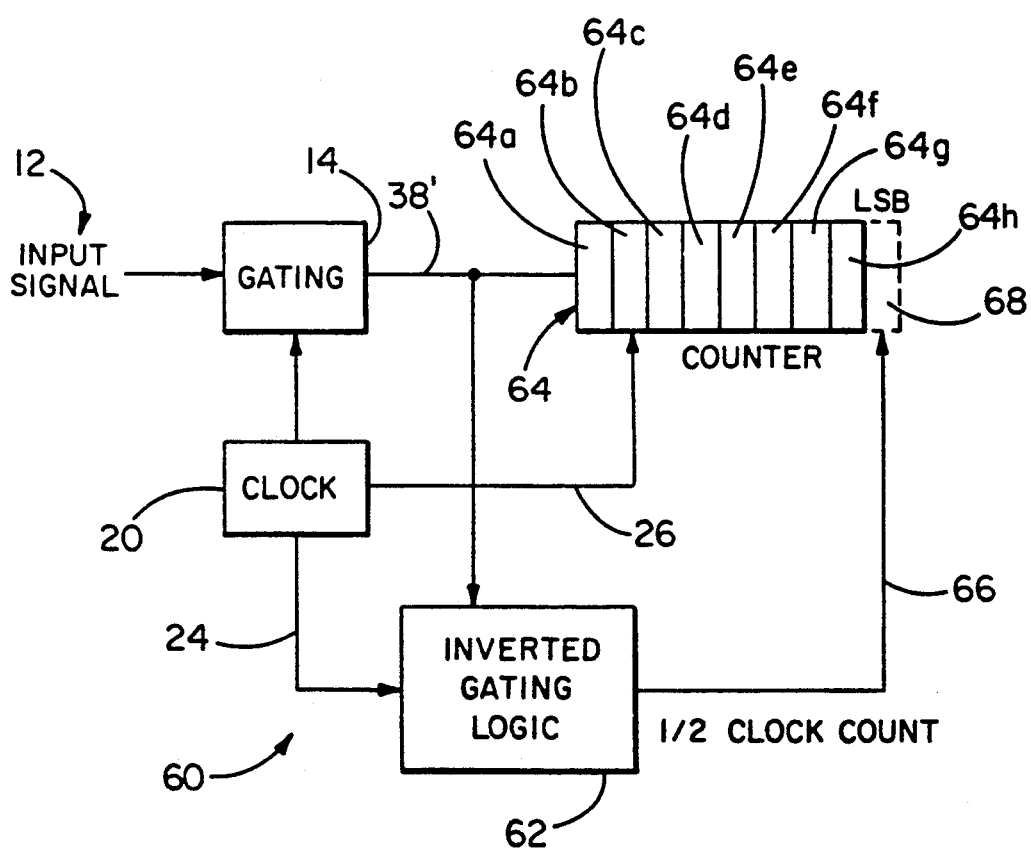
FIG. 2 is a schematic block diagram of a second embodiment of the frequency counter that uses only a single counter, but defines the frequency count with an additional bit of resolution that is determined by an inverted gating logic circuit.

Turning now to FIG. 2, a second frequency counter in accordance with the present invention is shown generally at reference numeral 60. Frequency counter 60 also responds to input signal 12, which is applied directly to gating logic circuit 14. However, unlike frequency counter 10, frequency counter 60 includes only a single counter 64, which in this embodiment, has 8 bits of resolution that are separately labeled 64a through 64h, bit 64a being the most significant bit (MSB). A gating signal is provided to counter 64 from gating logic circuit 14 through a lead 38', which is also connected to an inverted gating logic circuit 62. Reference oscillator 20 provides a clock signal to inverted gating logic circuit 62 through a lead 24. The clock signal is also supplied to counter 64 through a lead 26.

In frequency counter 60, noninverted clock cycles are not accumulated and averaged with accumulated inverted clock cycles. Instead, inverted gating logic circuit 62 determines an additional least significant bit (LSB) 68 that is added to the accumulated count of noninverted clock cycles in counter 64, thereby effectively doubling the resolution of that counter. Inverted gating logic circuit 62 responds to the time at which the sample period starts, i.e., the rising (or falling) edge of input signal 12 to determine whether the additional LSB 68, which is added to the total accumulated count, should be a binary 0 or 1. Since counter 64 is a binary counter, each bit represents a successive power of base 2, and each additional bit of resolution represents a doubling of resolution.

Figure 3:
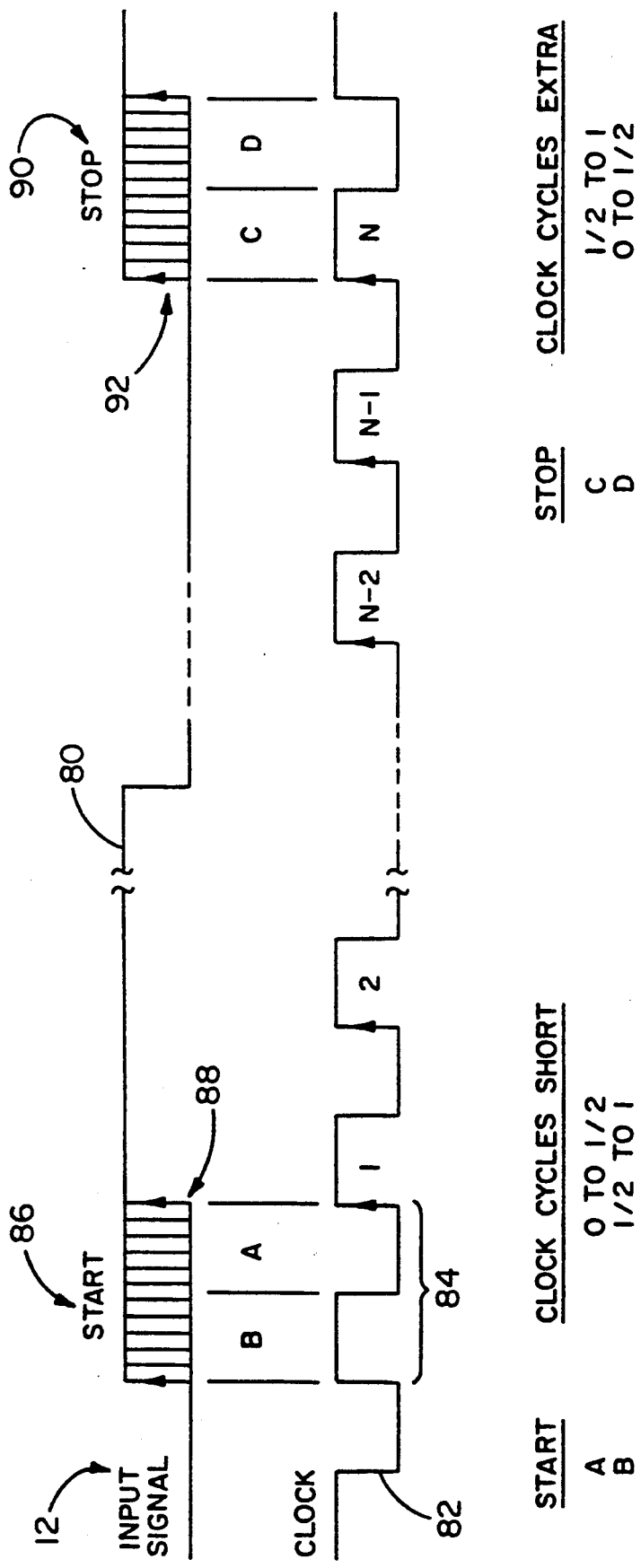
FIG. 3 is a timing diagram illustrating the logic for determining the nature of the additional bit of resolution used to define the frequency of an input signal in accordance with the present invention.

In FIG. 3, the logic implemented by inverted gating logic circuit 62 in determining additional LSB 68 is illustrated in respect to a timing diagram. In the timing diagram, an input signal waveform 80 is juxtaposed next to a clock signal waveform 82. The portion of input signal waveform 80 shown in the figure corresponds to slightly more than one cycle or period of input signal 12 during which an integer number, N, of clock cycles are counted to determine the frequency of the input signal. A clock cycle 84 comprises two half cycles or half periods, one interval high and the other low in level.

The count of clock cycles begins in this example with a rising edge 86 of input signal waveform 80. The rising edge can occur within a range 88 of time, triggering the start of the counting interval during which clock cycles are counted. Range 88 encompasses the two one-half periods of clock cycle 84, indicated respectively by reference letters A and B. The logic implemented by inverted gating logic circuit 62 (in FIG. 2) enables counting of the clock cycles only after rising edge 86 of the input signal waveform occurs. If rising edge 86 of input signal 12 occurs during clock half cycle interval A, from zero to one-half clock cycles may have elapsed before the start of the first count of clock cycles begins using prior art frequency counters. Similarly, if rising edge 86 starts the counting interval during clock half cycle interval B, from one-half to one clock cycles can elapse prior to the first clock cycle counted by a conventional frequency counter. To minimize the error developed by omitting at least one-half clock cycle from the count, inverted gating logic circuit 62 responds to the time that the rising edge occurs, i.e., determines whether the rising edge occurs during clock half cycle interval A or clock half cycle interval B, and if during interval B, adds an additional one-half clock cycle to the total integer count N.

Similarly, the end of the counting interval occurs with a next successive rising edge 90 of input signal waveform 80, which can occur during a range 92 that extends over two clock cycle half cycle intervals C and D. If the Nth clock cycle count begins just prior to the occurrence of rising edge 90 that stops the counting interval, from zero to one extra clock cycles may be counted. Inverted gating logic circuit 62 detects the occurrence of rising edge 90 of the input signal waveform and subtracts one-half clock cycle from the integer count N, if the end of the counting interval occurs during clock half cycle interval C, and subtracts zero clock cycles, if rising edge 90 occurs during clock half cycle interval D.

Table I defines the four possible states for the start and stop of the counting interval in terms of the Total Count Error that can arise depending upon whether the counting interval starts during either clock half cycle interval A or B, and stops during either clock half cycle interval C or D. Over the four possible states of the Counting Interval, the Total Count Error ranges from $-1$ to 1.

TABLE I

| Counting Interval | Clock Cycle Error Start | Stop | Total Count Error Clock Cycles | Correction Carryout LSB |
|---|---|---|---|---|
| A TO C | $-(0$ to $\frac{1}{2}) +$ | ($\frac{1}{2}$ to 1) | 0 to 1 | $-\frac{1}{2} = -1 + 0 + \frac{1}{2}$ |
| A TO D | $-(0$ to $\frac{1}{2}) +$ | (0 to $\frac{1}{2}$) | $-\frac{1}{2}$ to $\frac{1}{2}$ | $0 = -1 + 1 + 0$ |
| B TO C | $-(\frac{1}{2}$ to 1) $+$ | ($\frac{1}{2}$ to 1) | $-\frac{1}{2}$ to $\frac{1}{2}$ | $0 = -1 + 1 + 0$ |
| B TO D | $-(\frac{1}{2}$ to 1) $+$ | (0 to $\frac{1}{2}$) | $-1$ to 0 | $-\frac{1}{2} = -1 + 1 + \frac{1}{2}$ |

The Total Count resulting from applying the appropriate correction is shown below in Table II. Since the hardware required to add one-half clock count is easier to implement than that to subtract one-half clock count, the actual correction applied to increase resolution is implemented in terms of both a carryout count and an additional LSB that are added to a total count decremented by one clock cycle. The development of the appropriate Correction in terms of the four possible states during which the start and stop of the count interval begin and end is shown in Table II, where the count decremented is indicated by "N−1". By decrementing the count by one (or not counting one clock cycle of the actual number of clock cycles occurring during the counting interval), it will be apparent that the carryout count is either a 0 or 1, and the additional LSB is either a 0 or $+\frac{1}{2}$.

TABLE II

| | START (A) (B) | STOP (C) (D) |
|---|---|---|
| TOTAL COUNT = | N + (0 or $\frac{1}{2}$) − | ($\frac{1}{2}$ or 0) |
| = | (N-1) + (0 or $\frac{1}{2}$) − | ($\frac{1}{2}$ or 1) |

TABLE II-continued

| START | STOP |
|---|---|
| (A) (B) | (C) (D) |
| = (N-1) + (0 or ¼ or 1 or 1¼) | |

It is often preferable to average the frequency count over a number of periods or cycles of the input signal, thereby minimizing the effect of short-term variations in the frequency of the input signal from period to period and providing greater resolution in the determination of its frequency. Using this approach, a sample signal is supplied to define the interval over which the frequency of the input signal is determined. During this extended sample interval, which is typically defined by successive rising edges (or successive falling edges) of the sample signal, an integer N cycles of the input signal are counted. The sample time is a predefined time interval so that the frequency of the input signal is readily determined by simply dividing the number N of cycles of the input signal counted by the predefined time interval.

A fractional portion of a cycle of the input signal can occur after the start of the extended sample interval, and this fractional portion is often not normally counted by prior art counters. Similarly, a fractional portion of the cycle of the input signal can occur after the end of the extended sample interval, which should be subtracted from a RAW integer count of cycles of the input signal accumulated during the extended sample interval. Correction of the RAW integer count of cycles of the input signal for the fractional portion of the input signal not counted at the beginning of the sample interval and for the extra portion of the input signal waveform that should not have been counted at the end of the sample interval is disclosed in the patent application referenced above, which is commonly assigned to the same assignee as the present invention.

The present invention can be applied to provide double resolution in determining the correction that should be applied to the RAW count as taught in this patent application. Correction for the fractional portions of the input signal waveform occurring at the start and stop of the extended sample interval are expressed as a ratio of a partial count to a full count of reference clock cycles. The ratio of partial to full clock cycle counts at the end of each extended sample interval is stored for use in computing the corrected total count for the next extended sample interval. The present invention provides improved resolution in the determination of the partial count and the full count of clock cycles so that their ratio can also be determined with greater resolution.

Figure 4:
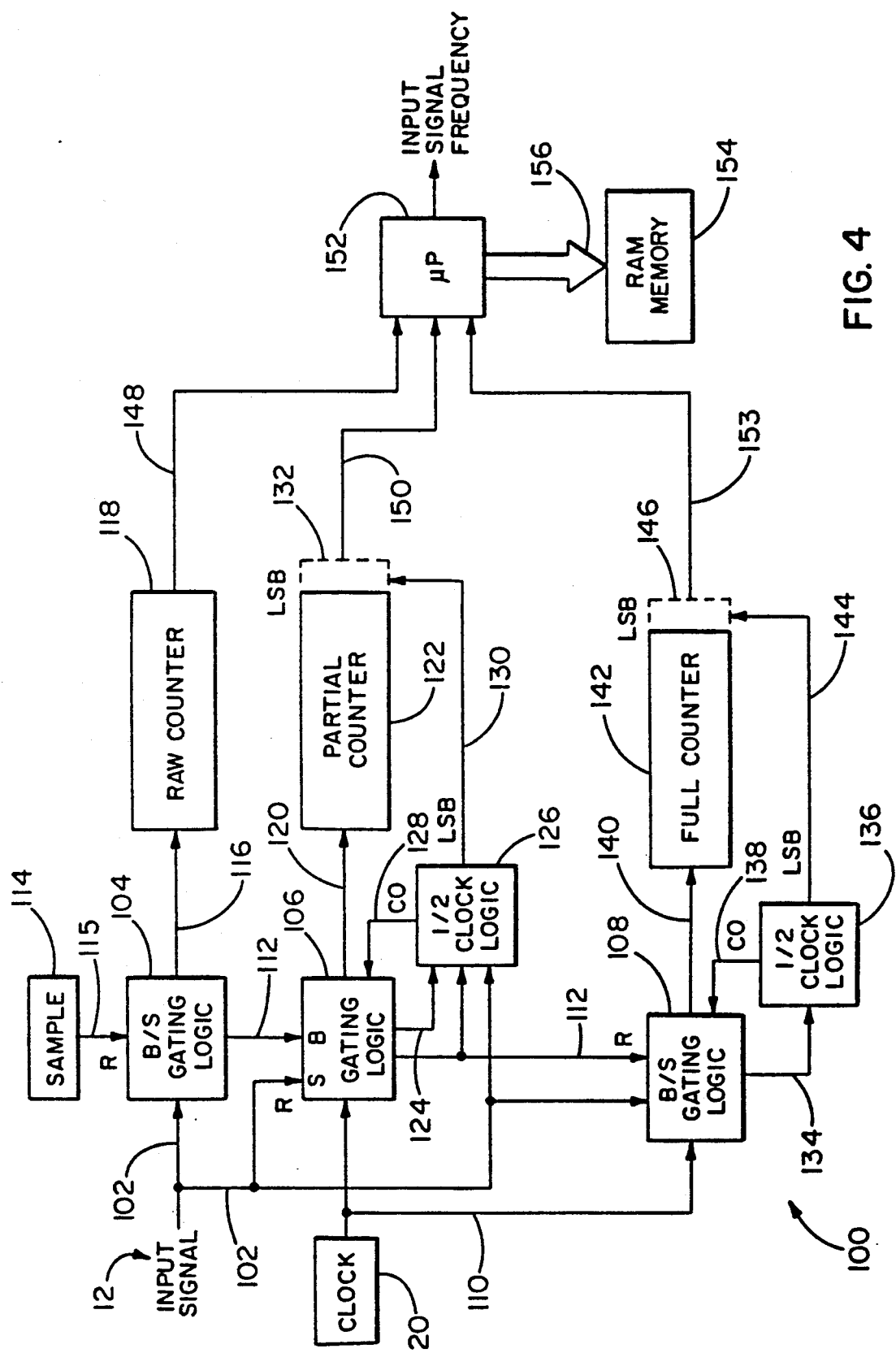
FIG. 4 is a schematic block diagram showing a third embodiment of the frequency counter.

Turning now to FIG. 4, a third embodiment of a frequency counter 100 is shown, which is used to provide increased resolution in correcting a RAW count, N, of cycles of input signal 12 using the ratios of partial to full counts of clock cycles at the beginning and end of an extended sample interval. Frequency counter 100 is provided with input signal 12 over a lead 102, which is connected to gating logic circuits 104, 106, and 108. Similarly, reference oscillator 20 is connected through a lead 110 to supply its clock signal to gating logic circuits 106 and 108. The sample signal that determines the extended sample interval is supplied from a sample signal source 114 to gating logic circuit 104 through a lead 115, and subsequently through leads 112 to gating logic circuits 106 and 108. Gating logic circuits 104, 106, and 108 use conventional logic gates to enable counting of input signal cycles and clock cycles, as will be apparent to those of ordinary skill in the art. Each gating logic circuit includes inputs labeled "B" (begin) that are connected to receive a signal that starts a counter accumulating counts during a sample interval. In addition, the gating logic circuits include inputs labeled "S" (stop) to which signals are applied causing the counter associated with each of the specific gating circuits to stop accumulating counts. A reset signal is also used for latching the count, transferring it out of the counter, and resetting the gating logic circuit and the counter associated with it to a 0 count. The reset input connected to a signal that performs this function is identified with an "R". The same signal may be connected to provide multiple functions depending upon the timing of its waveform.

Gating logic circuit 104 is connected through a lead 116 to a raw counter 118. Similarly, gating logic circuits 106 and 108 are respectively connected to a partial counter 122 and a full counter 142 through leads 120 and 140. The rising edge (or falling edge) of the gating logic circuit 104 sample signal provided stops raw counter 118, and after the accumulated count is latched and stored, resets raw counter 118 to 0 and enables the raw counter to start counting successive rising edges (or falling edges) of input signal 12.

The sample signal is also applied to the B input of gating logic circuit 106 to cause partial counter 122 to begin counting clock cycles, skipping the first clock cycle after the partial count sample interval begins. The rising edge of input signal 12, connected through lead 102 to the R and S input of gating logic circuit 106, stops partial counter 122 and resets it after its count is latched and stored. Gating logic circuit 106 is also connected through a lead 124 to a one-half clock logic circuit 126. One-half clock logic circuit 126 produces a carryout signal that is applied through a lead 128 back to gating circuit 106 to determine whether an additional carryout count should be enabled for partial counter 122 and an additional LSB 132, which is conveyed through a lead 130 to the partial counter. The additional LSB is either a 0 or 1 that is added to the count accumulated by partial counter 122.

Gating logic circuit 108 controls the application of the clock signal to full counter 142. A lead 134 connects gating logic circuit 108 to a one-half clock logic circuit 136, which determines whether to enable a carryout count and whether to provide a 0 or 1 for an additional LSB 146 that is added to the count in full counter 142 to double its resolution. The carryout signal is connected to gating logic circuit 108 through a lead 138 and the additional LSB is applied to full counter 142 through a lead 144. Full counter 142 omits one clock cycle after its sample interval begins on the rising edge (or falling edge) of input signal 12. The full counter stops accumulating clock cycles at the next rising edge (or falling edge) of the input signal. The sample signal resets gating logic circuit 108 and full counter 142 after the full count is latched and stored.

The count of input signal cycles accumulated by raw counter 118 during its extended sample interval is conveyed to a microprocessor 152 (or other processing circuitry) through a lead 148. Similarly, the count accumulated by partial counter 122, which has double the resolution due to the present invention, is provided as data to the microprocessor over a lead 150, while the count accumulated by full counter 142, also doubled in resolution, is provided over a lead 153. The data input to microprocessor 152 are transferred to a random access memory (RAM) 154 over data lines 156 and are used by the microprocessor in determining the frequency of input signal 12 as explained below.

The determination by one-half clock logic circuits 126 and 136 of the carryout signal and the additional LSB applied to the count accumulated in both the partial counter and the full counter provides the improvement in resolution of frequency counter 100. Accordingly, details of one-half clock logic circuits 126 and 136 are respectively shown in FIGS. 5 and 6.

Figure 5:
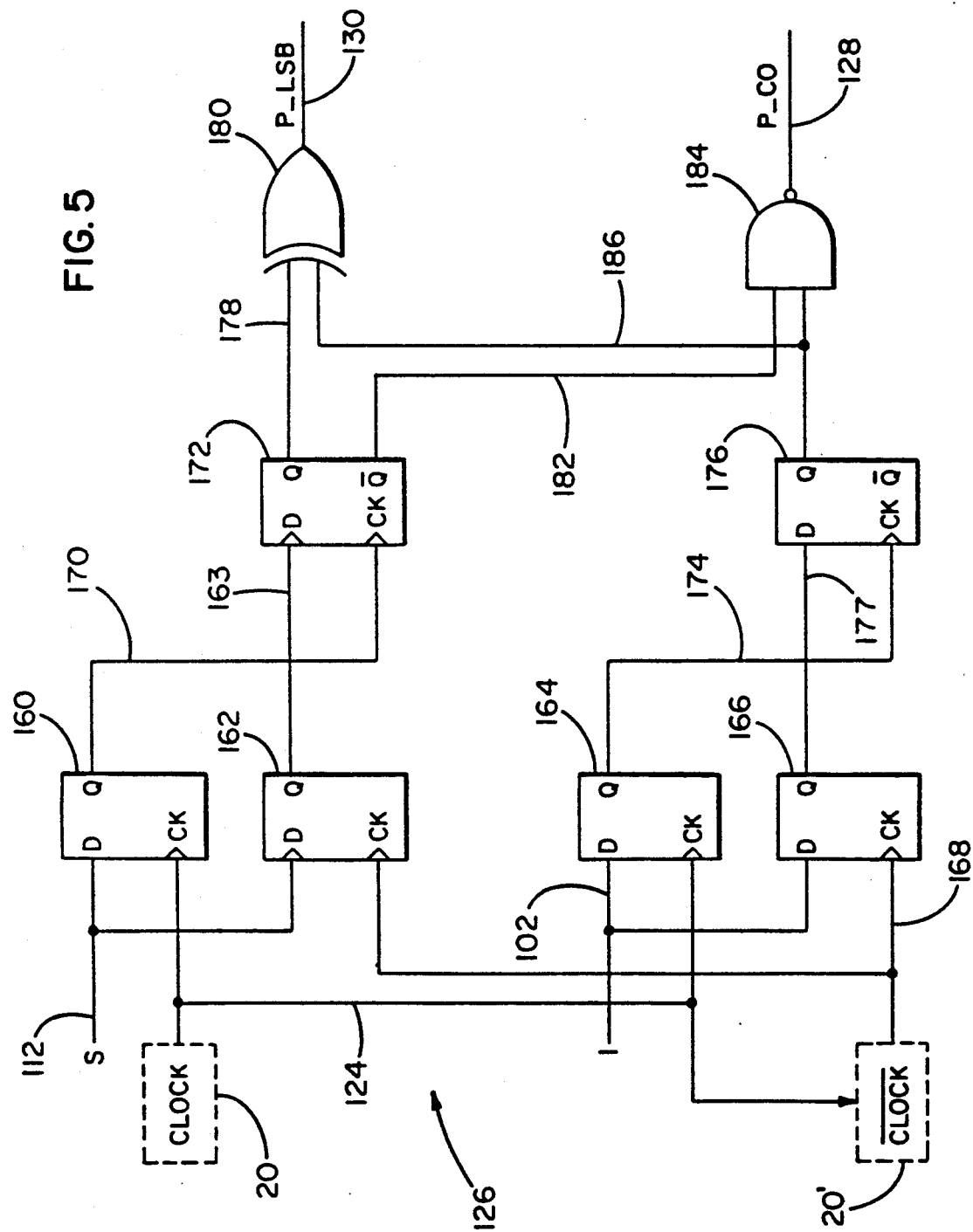
FIG. 5 is an electrical schematic diagram illustrating the logic circuit used to determine the least significant bit of the partial count in the third embodiment.

As shown in FIG. 5, one-half clock logic circuit 126 is provided with both a noninverted clock signal from reference oscillator 20 and an inverted clock signal (CLOCK) from an inverter 20'. The sample signal is supplied through lead 112 to DQ flip flops 160 and 162. Flip flop 160 receives the noninverted clock signal at its clock input and has an output connected through a lead 170 to the clock input of a DQ flip flop 172. The Q output of DQ flip flop 162 is connected through a lead 163 to the D input of flip flop 172; the clock input of DQ flip flop 162 receives the inverted clock signal through a lead 168.

The Q output of DQ flip flop 172 is connected through a lead 178 to an exclusive OR gate 180, the inverted Q output being connected through a lead 182 to one input of a NAND gate 184. A lead 186 joins the other input of exclusive OR gate 180 to the other input of NAND gate 184 and is connected to the Q output of a DQ flip flop 176.

Input signal 12 is applied through lead 102 to the D input terminal of DQ flip flops 164 and 166. The Q terminal of DQ flip flop 164 is connected to the clock input of DQ flip flop 176 through a lead 174, and the D input of DQ flip flop 176 is connected to the Q output of DQ flip flop 166 through a lead 177.

The first rising edge of the sample signal applied to DQ flip flop 160 causes its Q output to go high with the rising edge of the next clock pulse that reaches its clock input, applying a 0 to 1 transition to the clock input of flip flop 172. Similarly, the rising edge of the next inverted clock pulse applied to DQ flip flop 162 causes its Q output to go high, applying a logic level 1 to the D input of DQ flip flop 172. The Q output of DQ flip flop 172 depends upon the logic level applied to its D input at the time the noninverted clock signal is applied to DQ flip flop 160. If the D input of DQ flip flop 172 remains 0 at the time the ligic level 0 to 1 transition on the Q output of flip flip 160 is applied to the clock input of flip flop 172, the Q output of flip flop 172 will produce a logic 0 output. A 0 output on DQ flip flop 172 thus corresponds to the start of the partial sample interval during the clock half cycle interval A.

Conversely, if the rising edge of the partial sample interval occurs during the clock half cycle interval B, the Q output of flip flop 162 would have been set to 1, applying a logic level 1 to the D input of DQ flip flop 172 that, on the next rising edge of the noninverted clock signal, appears on the Q output of DQ flip flop 172.

DQ flip flop 164 has a logic level on its Q output that depends upon the timing of the rising edges of input signal 12 and of the noninverting clock signal. After input signal 12 goes high, a transition to logic level 1 occurs on output Q of the flip flop as the rising edge of the clock signal occurs, thereby applying a rising edge to the clock input of DQ flip flop 176. The output of DQ flip flop 176 depends upon the state of its D input, which in turn depends on the Q output of DQ flip flop 166 at that time. If the D input of DQ flip flop 176 is already at a logic level 1 when the noninverting clock signal occurs (following the occurrence of a rising edge of input signal 12), the Q output of DQ flip flop 176 is a logic level 1. This state corresponds to the condition where the rising edge of input signal 12 occurs during clock half cycle interval C. Under this circumstance, DQ flip flop 166 propagates the logic level 1 that is applied to the D input to its Q output when the rising edge of the inverted clock signal is applied to the clock input of the flip flop. Conversely, if the rising edge of input signal 12 occurs during the clock half cycle interval D, the Q output of DQ flip flop 166 is a logic level 0, causing a logic level 0 to appear on the Q output of DQ flip flop 176 when the rising edge of the next noninverted clock cycle occurs, following the rising edge of the input signal, i.e., at the end of the partial sample interval.

The output of exclusive OR gate 180 is a logic level 1 only if one, and only one, of its inputs is a logic level 1. Accordingly, if the extended sample interval begins during clock half cycle interval A, causing a logic level 0 from DQ flip flop 172 to be applied to one input of exclusive OR gate 180, and, if the rising edge of input signal 12 occurs during clock half cycle interval C, causing a logic level 1 to be applied to the other input of exclusive OR gate 180, the output of the exclusive OR gate is a logic level 1. A logic level 1 is also produced at this output if the extended sample interval begins during clock half cycle interval B, causing the Q output of DQ flip flop 172 to be a logic level 1, and, if the rising edge of input signal 12 occurs during clock half cycle interval D, causing the Q output of DQ flip flop 176 to be a logic level 0. In either instance, the additional LSB of the partial count, represented in FIG. 5 by P_LSB, is a logic level 1 that is output over lead 130.

NAND gate 184 produces a logic level 0 output only if both its inputs are at logic level 1; otherwise, NAND gate 184 has a logic level 1 output, which comprises the carryout signal. Accordingly, the output of NAND gate 184 is a logic level 0 only when the rising edge of the sample signal occurs in clock half cycle interval A and the rising edge of the input signal occurs during clock half cycle interval C. Under all other circumstances, NAND gate 184 produces a logic level 1 carryout, which is conveyed over lead 128 and identified in FIG. 5 as P_CO. A logic level 1 on the carryout signal causes gating logic circuit 106 (FIG. 4) to enable an additional clock cycle count by partial counter 122.

Figure 6:
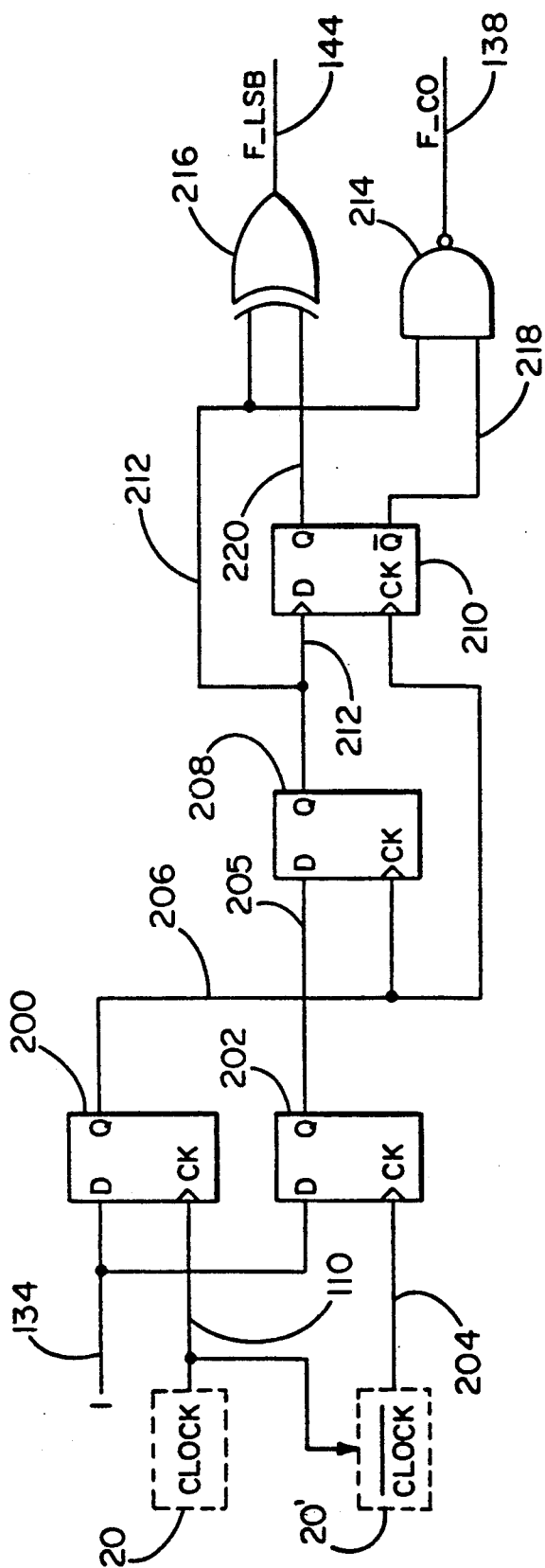
FIG. 6 is an electrical schematic diagram showing the logic circuit employed to determine the least significant bit of the full count in the third embodiment.

Referring now to FIG. 6, one-half clock logic circuit 136 is illustrated in greater detail. Input signal 12 is applied to one-half clock logic circuit 136 through lead 134, which is connected to the D inputs of DQ flip flops 200 and 202. The noninverted clock signal is connected through a lead 110 to a clock input of DQ flip flop 200, and is inverted in inverter 20' to provide the inverted clock signal, which is supplied through a lead 204 to the clock input of DQ flip flop 202. The Q output of DQ flip flop 200 is connected to the clock inputs of series-connected DQ flip flops 208 and 210. A lead 205 connects the Q output of DQ flip flop 202 to the D input of DQ flip flop 208. From the Q output of DQ flip flop 208, a lead 212 is connected to the D input of DQ flip flop 210 and to one input of an exclusive OR gate 216 and one input of an exclusive NAND gate 214. The Q output of DQ flip flop 210 is connected to the other input of exclusive OR gate 216, while the $\bar{Q}$ (inverted) output of the flip flop is connected through a lead 218 to the other input of NAND gate 214.

On the occurrence of the first clock pulse after the rising edge of input signal 12, DQ flip flop 200 produces a logic level 0 to 1 transition on its Q output, which is applied to the clock inputs of DQ flip flops 208 and 210. The outputs of DQ flip flops 208 and 210 thus depend on the state of their D inputs at that time. Specifically, the D input of DQ flip flop 208 is derived from the Q output of DQ flip flop 202 and is a logic level 0 if the rising edge of the inverted clock signal did not occur before the rising edge of the noninverted clock signal after the rising edge of the input signal. In other words, if the rising edge of the input signal occurs during clock half cycle interval A, the Q output of DQ flip flop 202 is logic level 0; however, if the rising edge of input signal 12 occurs during clock half cycle interval B, the Q output of DQ flip flop 202 is a logic level 1. Accordingly, the Q output of DQ flip flop 208 is a logic level 1 upon the occurrence of the next rising edge of the non-inverted clock signal if the rising edge of the input signal occurs during clock half cycle interval B.

While input signal 12 is low, the Q outputs of both DQ flip flop 200 and 202 are switched to logic level 0. If the next rising edge of input signal 12 occurs during clock half cycle interval C, the rising edge of the inverted clock signal causes the Q output of DQ flip flop 202 to change to a logic level 1, thereby applying that logic level to the D input of DQ flip flop 208. Subsequently, when the next rising edge of the noninverted clock signal causes DQ flip flop 200 to produce a logic level 0 to 1 transition that is applied as a clock input to DQ flip flops 208 and 210, a logic level 1 appears on the Q output of DQ flip flop 208. The previous logic level on the Q output of DQ flip flop 208 is propagated to the Q output of DQ flip flop 210. Therefore, if the successive rising edges of input signal 12 occurred during clock half cycle intervals A and C, or during clock half cycle intervals B and D, exclusive OR gate 216 produces a logic level 1 output on lead 144. The signal on lead 144 is identified in FIG. 6 by F_LSB, the additional LSB for full counter 142. Conversely, it will be apparent that if the successive rising edges of input signal 12 occur during intervals A and D, or B and C, the output of exclusive OR gate 216 is a logic level 0.

The Q output of DQ flip flop 208 and the Q̄ output of DQ flip flop 210 are thus both applied to the inputs of exclusive NAND gate 214. The NAND gate produces a logic level 0 output only if both its inputs are at logic level 1. This condition occurs only when successive rising edges of input signal 12 occur during clock half cycle intervals A and C. Under all other conditions, the output of exclusive NAND gate 214 is a logic level 1. In FIG. 6, the output signal of exclusive NAND gate 214 is conveyed via lead 138 and is identified by F_CO, i.e., the carryout signal that determines whether gating logic circuit 108 enables an additional clock cycle to be counted by full counter 142.

Figure 7:
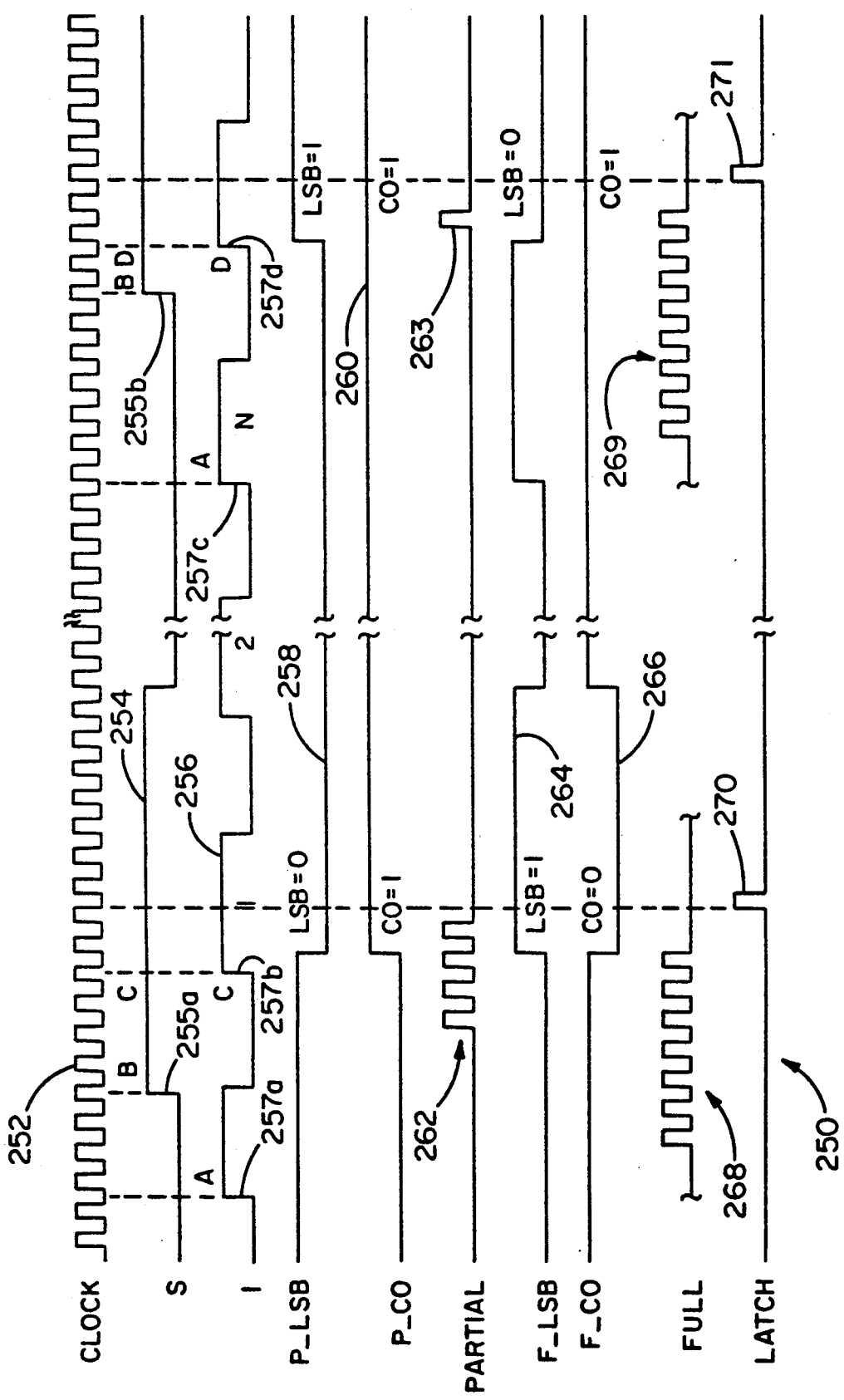
FIG. 7 is a timing chart showing how the partial count and full count are determined.
Figure 8:
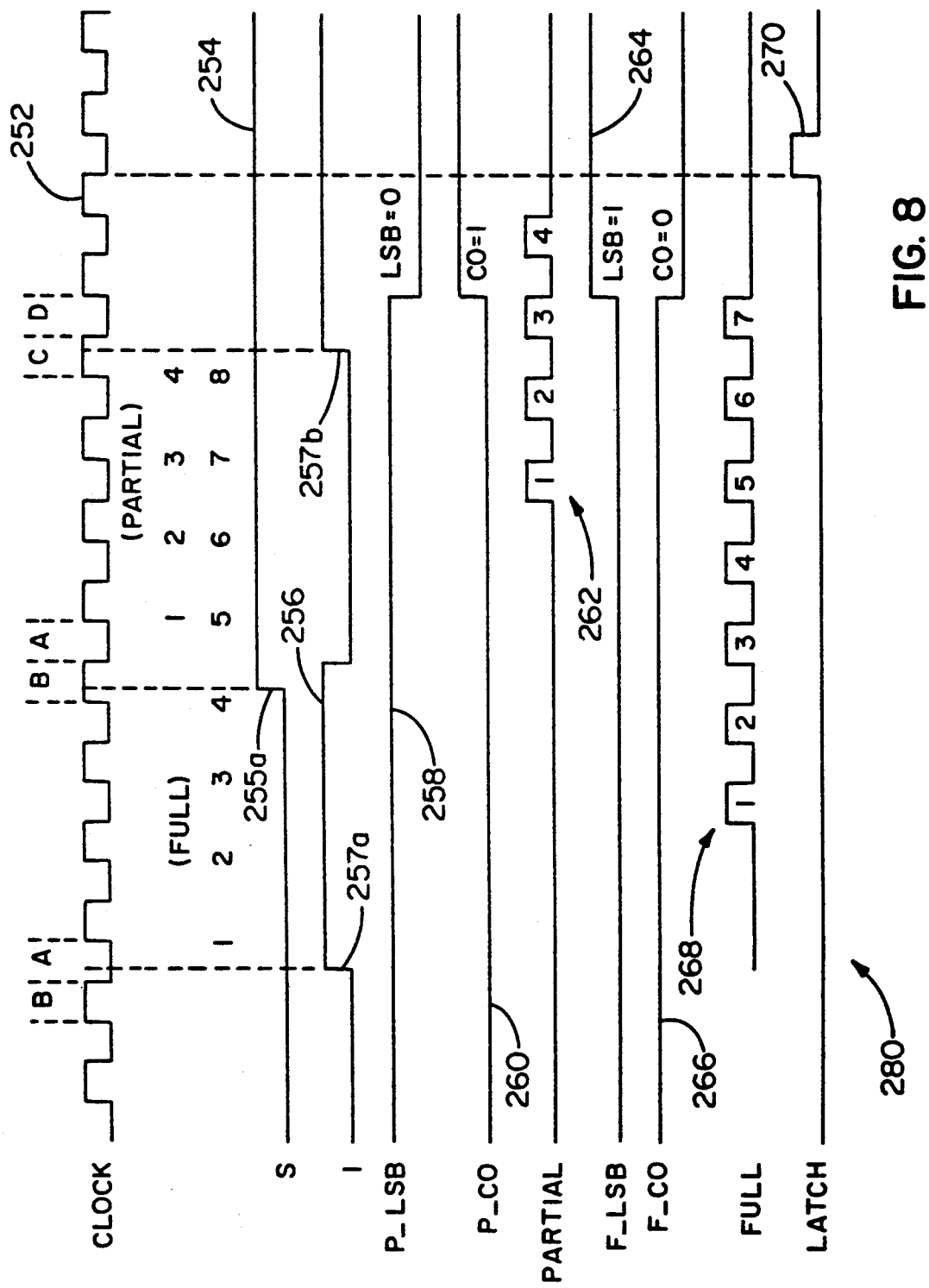
FIG. 8 is a timing chart that shows details of the procedure used in doubling the resolution of the partial and full count of the input signal shown in FIG. 7.

Referring to FIGS. 7 and 8, the timing of the various signals used to count the frequency of input signal 12 are illustratively shown for an exemplary specific timing diagram 250. In FIG. 7, the rising edges of an input signal waveform 256 and a sample waveform 254 are identified with the letters A through D to indicate the clock half cycle intervals of a clock signal 252 in which the rising edge of the respective waveforms occurs. For example, on the left side of timing diagram 250 (as also shown in greater detail in FIG. 8), sample waveform 254 includes rising edge 255a that occurs during a clock half cycle interval B. A successive rising edge 255b of sample waveform 254 also occurs during the clock half cycle interval B, as shown in FIG. 7, on the right side of timing diagram 250. The time between rising edges 255a and 255b thus comprises the extended sample interval during which the frequency of input waveform 256 is determined.

At the beginning of the sample interval, as shown in detail in FIG. 8, a full count of clock pulses is accumulated corresponding to the period of one cycle of input signal waveform 256, extending from a rising edge 257a that occurs during clock half cycle interval A to a successive rising edge 257b that occurs during clock half cycle interval C. During this full count sample interval that extends from rising edge 257a to rising edge 257b, full counter 142 (shown in FIG. 4) accumulates seven clock cycles, as shown generally at 268. Although eight clock cycles start during this interval, the first clock cycle is decremented or not counted to facilitate the correction required for doubling the resolution of the counter, as already explained.

The partial count used in determining the ratio of partial to full counts is measured between rising edge 255a of sample waveform 254 and rising edge 257b of input signal waveform 256. Although four rising edges of clock signal 252 occur between rising edge 255a and rising edge 257b, the first clock cycle is omitted. However, four counts are actually accumulated in partial counter 122 (shown in FIG. 4), with the inclusion of the carryover count that results from the correction employed to double the resolution of the partial counter. The partial count (corrected to include the carryover count) is indicated generally at reference numeral 262 in FIGS. 7 and 8. Both partial count 262 and full count 268 are offset in time by one half clock cycle from the inception of the first clock cycle counted, due to propagation delays within gating logic circuits 106 and 108.

The partial count that is output to microprocessor 152 includes an additional LSB. The value of the additional LSB applied to the partial count, P_LSB, is determined by the clock half cycle intervals in which rising edges 255a and 257b occur. In the example shown in FIG. 8, these rising edges occur in clock half cycle intervals B and C. Accordingly, referring back to Table I, it will be apparent that P_LSB has a logic level of 0. Similarly, the carryout signal for the partial count, P_CO, which is represented by a waveform 260, has a logic level 1.

Applying the rules shown in Table I to clock half-cycle the intervals in which rising edges 257a and 257b occur results in a logic level 1 for the F_LSB, as represented by a waveform 264. The carryout signal for full counter, F_CO, has a logic level 0, as indicated by a waveform 266. Thus, the full count shown in FIG. 8, including the values of F_LSB and F_CO, is equal to 7.5 clock cycles. The values of P_LSB, the partial count (including carryout) F_LSB, and the full count (including carryout) are latched and transferred to microprocessor 152 by a latch signal 270, which causes the partial and full counter to be reset. Latch signal 270 also causes a raw count, N, corresponding to the total number of cycles of input waveform 12 accumulated during the previous extended sample interval to be latched and stored for correction by the ratios of the partial to full counts that are determined at the beginning and end of the extended sample interval.

On the right side of FIG. 7, at the end of the extended sample interval between rising edges 255a and 255b, a partial count is accumulated between a rising edge 255b of sample waveform 254 and a rising edge 257d of input waveform 256. As shown at 263, the partial count includes only the carryover count, the first clock cycle count having been omitted. Similarly, a full count of clock pulses occurring between a rising edge 257c of input waveform 256 and rising edge 257d of that waveform is accumulated in full counter 142, as shown generally at 269. In this case, a total of eight clock cycles is accumulated, including seven clock cycles and one carryover count. Applying the rules shown in Table I, the total corrected partial count, including a P_LSB logic level 1, is equal to 1.5. Similarly, the full count is equal to 8, based upon an F_LSB equal to logic level 0. A latch signal 271 causes the results of the count accumulated in raw counter 118, and the values for partial and full count corrected for double resolution as described above, to be latched and transferred to microprocessor 152. Latch signal 271 also resets raw counter 118, partial counter 122, and full counter 142 to zero, preparing them to accumulate counts in their next respective sample intervals. The raw count N is then corrected by adding the ratio of partial to full counts determined at the beginning of the extended sample interval (4/7.5) and subtracting the corresponding ratio determined at the end of the extended sample interval (1.5/8).

While the present invention has been disclosed in respect to several preferred embodiments, those of ordinary skill in the art will appreciate that further modifications may be made thereto within the scope of the claims that follow. Accordingly, it is not intended that the disclosure of the invention in any way limit the scope of the invention.

The invention in which an exclusive property or privilege is claimed is defined as follows:

1. A circuit having improved resolution for counting a test signal with respect to cycles of a clock signal produced by a reference oscillator, comprising:
    a. counter means for accumulating an integer count of cycles of the clock signal during a sample interval, said counter means including:
        i. a partial counter that accumulates a partial count of clock cycles during a partial count sample interval that begins synchronously with a cycle of a sample signal, is less than one cycle of the test signal in duration, and ends synchronously with a cycle of the test signal; and
        ii. a full counter that accumulates a full count of clock cycles during a full count sample interval that begins synchronously with one cycle of the test signal and ends synchronously with that cycle of the test signal;
    b. gating means, connected to receive the clock signal and the test signal, for providing a gated clock signal that is applied to the counter means only during the sample interval; and
    c. logic means, connected to receive the clock signal and the gated clock signal, for determining a correction added to the integer count as a function of whether the sample interval begins and ends during a first or a second half of the clock cycle then occurring, the correction being equal to:
        i. $-\frac{1}{2}$, if the sample interval begins during the second half of a clock cycle and ends during the first half of a clock cycle; or
        ii. 0, if the sample interval begins during the second half of a clock cycle and ends during the second half of a clock cycle; or
        iii. 0, if the sample interval begins during the first half of a clock cycle and ends during the first half of a clock cycle; or
        iv. $\frac{1}{2}$, if the sample interval begins during the first half of a clock cycle and ends during the second half of a clock cycle, whereby the correction effectively doubles the resolution of the integer count;
    said logic means including a partial count logic circuit that determines a partial count correction that is added to the partial count accumulated during the partial count sample interval to define a corrected partial count with a resolution to $\frac{1}{2}$ cycle of the clock signal, and a full count logic circuit that determines a full count correction that is added to the full count to define a corrected full with a resolution to $\frac{1}{2}$ cycle of the clock cycle, the partial count correction and the full count correction being determined consistent with (c)(i) through (c)(iv) above.

2. The circuit of claim 1, wherein the counter means accumulates less than the integer count of clock cycles that occur during the sample interval by a predefined quantity, and wherein the logic means are further operative to correct for the omission of this predefined quantity from the integer count.

3. The circuit of claim 1, wherein the logic means comprise a plurality of logic gates.

4. The circuit of claim 1, wherein the sample interval corresponds to one cycle of the test signal.

5. The circuit of claim 1, further comprising means for counting an integer number of cycles of the test signal occurring during an extended sample interval that starts and stops synchronously with the clock signal, producing a raw integer count.

6. The circuit of claim 5, further comprising processor means for determining a fractional portion of a cycle of the test signal that occurs after the end of the extended sample interval, the fractional portion being equal to a ratio of the corrected partial count and the corrected full count.

7. The circuit of claim 6, further comprising means for storing the fractional portion from a preceding extended sample interval, the processor means being further operative to correct the raw integer count by adding to it the fractional portion at the end of the preceding extended sample interval and subtracting from it the fractional portion at the end of the current extended sample interval.

8. A method for counting a test signal in respect to cycles of a clock signal with improved resolution, comprising the steps of:
    accumulating a count of cycles of the clock signal during a sample interval;
    accumulating a partial count of clock cycles during a partial count sample interval that begins synchronously with a cycle of a sample signal, is less than one cycle of the test signal in duration, and ends synchronously with a cycle of the test signal; and
    accumulating a full count of clock cycles during a full count sample interval that begins synchronously with one cycle of the test signal and ends synchronously with that cycle of the test signal;
    determining a correction that is added to the sample count as a function of whether the sample interval begins and ends during a first or a second half of the clock cycle then occurring, the correction being equal to:
a. $-\frac{1}{2}$, if the sample interval begins during the second half of a clock cycle and ends during the first half of a clock cycle; or
b. 0, if the sample interval begins during the second half of a clock cycle and ends during the second half of a clock cycle; or
c. 0, if the sample interval begins during the first half of a clock cycle and ends during the first half of a clock cycle; or
d. $\frac{1}{2}$, if the sample interval begins during the first half of a clock cycle and ends during the second half of a clock cycle, whereby the correction effectively doubles the resolution of the sample count;

determining a partial count correction that is added to the partial count to define a corrected partial count with a resolution to $\frac{1}{2}$ cycle of the clock signal; and determining a full count correction that is added to the full integer count to define a corrected full count with a resolution of $\frac{1}{2}$ cycle of the clock signal, the partial count correction and the full count correction being determined consistent with (a) through (d) above.

9. The method of claim 8, wherein a predefined quantity less than the count of clock cycles that actually occur during the sample interval are accumulated, further comprising the step of correcting the count for the omission of this predefined quantity.

10. The method of claim 8, wherein the sample interval corresponds to one cycle of the test signal.

11. The method of claim 8, wherein the sample interval begins synchronously with a cycle of a sample signal, is less than one cycle of the test signal in duration, and ends synchronously with a cycle of the test signal.

12. The method of claim 8, further comprising the steps of:
counting an integer number of cycles of the test signal occurring during an extended sample interval that starts and stops synchronously with the clock signal, producing a raw integer count.

13. The method of claim 12, further comprising the step of determining a fractional portion of a cycle of the test signal that occurs after the end of the extended sample interval, the fractional portion being equal to a ratio of the corrected partial count and the corrected full count.

14. The method of claim 13, further comprising the steps of:
storing the fractional portion from an immediately preceding extended sample interval; and
correcting the raw integer count by:
adding to it the fractional portion for the immediately preceding extended sample interval; and
subtracting from it the fractional portion for the current extended sample interval.

* * * * *